United States Patent [19]
Huang

[11] Patent Number: 6,004,843
[45] Date of Patent: Dec. 21, 1999

[54] PROCESS FOR INTEGRATING A MOS LOGIC DEVICE AND A MOS MEMORY DEVICE ON A SINGLE SEMICONDUCTOR CHIP

[75] Inventor: Jenn Ming Huang, Hsin Chu, Taiwan

[73] Assignee: Taiwan Semiconductor Manufacturing Company, Hsin-Chu, Taiwan

[21] Appl. No.: 09/073,951

[22] Filed: May 7, 1998

[51] Int. Cl.[6] .................... H01L 21/8242; H01L 21/336; H01L 21/3205; H01L 21/4763

[52] U.S. Cl. .................... 438/241; 438/258; 438/592; 438/952

[58] Field of Search .................... 438/241, 258, 438/592, 952

[56] References Cited

U.S. PATENT DOCUMENTS

| | | | |
|---|---|---|---|
| 5,126,279 | 6/1992 | Roberts | 437/52 |
| 5,480,814 | 1/1996 | Wuu et al. | 437/41 |
| 5,573,980 | 11/1996 | Yoo | 437/200 |
| 5,605,853 | 2/1997 | Yoo et al. | |
| 5,612,238 | 3/1997 | Sato et al. | |
| 5,691,235 | 11/1997 | Meikle et al. | |

Primary Examiner—John F. Niebling
Assistant Examiner—Joseth A. Imes
Attorney, Agent, or Firm—George O. Saile; Stephen B. Ackerman

[57] ABSTRACT

A method for fabricating both MOS memory devices, and MOS logic devices, on a single silicon chip, has been developed. The process features combining process steps for both device types, however using a self-aligned contact structure, in the MOS memory device region, for purposes of increasing device density, while using metal silicide regions, only in MOS logic device regions, for purposes of improving device performance. An organic coating protects MOS memory devices, from procedures used to remove insulator layers from silicon surfaces of MOS logic devices, prior to the formation of the self-aligned silicide regions, on the exposed silicon surfaces, in MOS logic device regions.

28 Claims, 4 Drawing Sheets

PROCESS FOR INTEGRATING A MOS LOGIC DEVICE AND A MOS MEMORY DEVICE ON A SINGLE SEMICONDUCTOR CHIP

RELATED PATENT APPLICATION

"PROCESS FOR FABRICATING MOS MEMORY DEVICES, WITH A SELF-ALIGNED CONTACT STRUCTURE, AND MOS LOGIC DEVICES, WITH SALICIDE, BOTH ON A SINGLE SEMICONDUCTOR CHIP" by J. Y. Lee, M. S. Liang, of Taiwan Semiconductor Manufacturing Corp., invention disclosure #TSMC96-303, filed Apr. 21, 1997, now Ser. No. 08/844,630, assigned to a common assignee.

BACKGROUND OF THE INVENTION (1) Field of the Invention

This invention relates to an integrated process allowing the fabrication of logic devices, and memory devices, to be accomplished on a single semiconductor chip.

(2) Description of Prior Art

Advanced semiconductor chips, now being manufactured in industry, are composed of logic or memory devices. Logic devices are used to process information or data, while memory devices are used for data storage. These two types of devices can be found in almost all computers, however they are usually found on specific chips, reserved for either logic or memory applications. In systems in which logic and memory devices are packaged separately, data signals between the two may have to pass through several levels of packaging, which can result in undesirable propagation delays. In addition the manufacturing costs for fabricating wafers producing only logic chips, and wafers with only memory chips, are greater than if both logic and memory applications can be incorporated on the same chip. Therefore for performance and cost reasons the semiconductor industry has been motivated to produce a semiconductor chip with both the desired logic and memory requirements.

This invention will describe a novel fabrication process that simultaneously allows, memory devices to be fabricated with a self-aligned contact, (SAC), structure, and logic devices, to be fabricated with salicide, (Self-ALigned metal silICIDE). The SAC feature, used in the MOS memory device, results in a decrease in the area needed for metal, or polysilicon contact to source and drain regions, thus allowing miniaturization of MOS memory devices to be realized. The use of low resistance Salicide layers, result in performance increases for MOS logic devices. Prior art, such as Yoo, in U.S. Pat No. 5,573,980, describes a process for forming a salicided, SAC structure, for a static random access memory device, however that prior art does teach the process described in this invention, that is a process used to integrate a salicided, logic device, and a non-salicided, memory device, featuring a SAC structure.

SUMMARY OF THE INVENTION

It is an object of this invention to provide a process for fabricating MOS memory devices and MOS logic devices on the same semiconductor chip, or integrated circuit.

It is another object of this invention to fabricate the MOS memory devices featuring a SAC structure, that allows density enhancements to be realized.

It is yet another object of this invention to fabricate the MOS logic devices using a salicide feature, that allows performance enhancements to be realized.

It is still yet another object of this invention to use an organic layer as a mask for MOS memory devices, allowing masking insulator layers to be removed from silicon surfaces of MOS logic devices, allowing subsequent salicide formation to proceed, on exposed silicon surfaces, but only in MOS logic areas.

In accordance with the present invention a fabrication process is described for integrating MOS memory devices and MOS logic devices on the same silicon chip. Thick field oxide regions, in the form of silicon oxide filled, shallow trenches, are first created for isolation purposes. A gate insulator layer is grown on the surface of the semiconductor substrate, followed by a deposition of a polysilicon layer, doped in situ during deposition, or grown intrinsically and doped via an ion implantation procedure. A first silicon oxide layer, and a first silicon nitride layer, are next deposited. Patterning, via photolithographic and anisotropic etching procedures, are next performed to create polysilicon gate structures, capped by the first silicon nitride layer, and by the first silicon oxide layer. After formation of lightly doped source and drain regions, the formation of silicon nitride spacers on the sides of the polysilicon gate structures, and the formation of heavily doped source and drain regions are accomplished. A second silicon oxide layer, used as a Resist Protection Oxide, (RPO), is next deposited, followed by the application of an organic, bottom anti-reflective coating, (BARC). A photoresist blockout mask, is then formed, overlying the BARC, only in the region to be used for MOS memory devices. The unprotected BARC, in regions to be used for MOS logic devices, is partially etched back, exposing the top surface of the RPO layer, that in turn overlays the insulator capped, polysilicon gate structures. The exposed RPO layer, and the capping silicon nitride layer, are next removed, exposing polysilicon gate structures, capped with the first silicon oxide layer, in the region to be used for MOS logic devices. After removal of the remaining BARC, in the MOS logic region, the capping first silicon oxide layer, as well as the remaining RPO layer, are removed, resulting in non-capped, polysilicon gate structures. The removal of the masking photoresist layer, and the BARC, in the MOS memory region, is next addressed, exposing RPO protected, MOS memory regions. The formation of salicide regions, on the top surface of the polysilicon gate structures, and the source and drain regions, is than accomplished, only in MOS logic regions, while counterpart silicon surfaces, in the MOS memory region, are still protected by the RPO layer, and the capping insulator layers, on the polysilicon gate structures. A thick, third silicon oxide layer is then deposited, followed by the creation of a SAC opening between insulator capped, polysilicon gate structures, in the MOS memory region, exposing a source and drain region. This is followed by the creation of a polysilicon, SAC structure, in the SAC opening.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
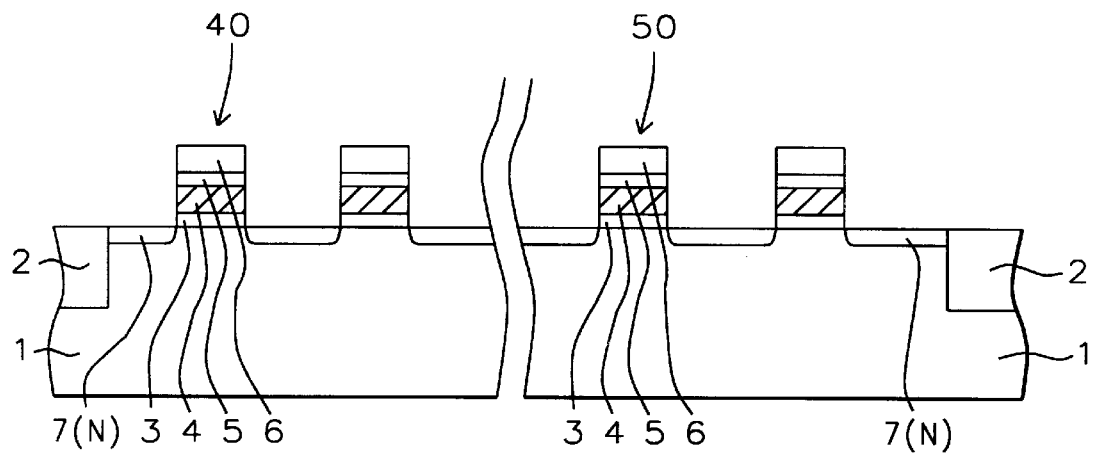
FIGS. 1–8, which schematically, in cross-sectional style, illustrates the stages of fabrication used to simultaneously create MOS memory devices, using a self-aligned contact structure, as well as MOS logic devices, featuring a salicide layer, on a semiconductor substrate.

The fabrication process used to simultaneously create MOS memory devices, with SAC structures, and MOS logic devices, with salicide regions, on a single semiconductor chip will now be covered in detail. FIG. 1, shows area 50, to be used for fabrication of the MOS memory devices, while MOS logic devices will be fabricated in area 40. Both memory and logic devices will be described as N type, MOSFET devices, however this invention can also be accomplished using P channel, or PFET devices, by creating N wells in specific areas of the semiconductor substrate, and using P type ion implantation dopants for P type source and drain regions.

A P type, single crystalline silicon substrate 1, having a <100> crystallographic orientation is used, and shown schematically in FIG. 1. Insulator filled shallow trench, (STI), regions 2, are next formed in semiconductor substrate 1, for purposes of isolation. Briefly shallow trenches are created in semiconductor substrate 1, using photolithographic and anisotropic reactive ion etching, (RIE), procedures, and after the removal of the masking photoresist shape, an insulator deposition, and the removal of unwanted insulator, via a RIE, or a chemical mechanical polishing, (CMP), procedure, is performed, resulting in STI regions 2. A thin gate insulator layer 3, of silicon dioxide, is next thermally grown in an oxygen-steam ambient, at a temperature between about 750 to 1000° C., to a thickness between about 20 to 200 Angstroms. Gate insulator layer 3, is grown in both MOS memory region 50, as well as in MOS logic region 40. A polysilicon layer 4, is next deposited via low pressure chemical vapor deposition, (LPCVD), procedures, to a thickness between about 1000 to 2000 Angstroms, using silane as a source. Polysilicon layer 4, can be in situ doped, N type, during deposition, via the addition of phosphine, or arsine, to the silane ambient, or polysilicon layer 4, can be deposited intrinsically, then doped via ion implantation of either arsenic or phosphorous.

A first silicon oxide layer 5, is next deposited using either LPCVD or plasma enhanced chemical vapor deposition, (PECVD), procedures, to a thickness between about 200 to 1000 Angstroms, using tetraethylorthosilicate, (TEOS), as a source, followed by the deposition of a first silicon nitride layer 6, via LPCVD or PECVD procedures, to a thickness between about 1000 to 2000 Angstroms. Photolithographic and anisotropic RIE procedures, using $SF_6$ as an etchant for first silicon nitride layer 6, using $CHF_3$ as an etchant for first silicon oxide layer 5, and using $Cl_2$ as an etchant for polysilicon layer 4, are employed to create the insulator capped, polysilicon gate structures, shown schematically in FIG. 1. After removal of the photoresist shape, used as a mask for polysilicon gate patterning, via plasma oxygen ashing and careful wet cleans, lightly doped source and drain regions 7, are created via an ion implantation procedure, using arsenic or phosphorous, at an energy between about 25 to 50 KeV, at a dose between about 5E12 to 5E13 atoms/$cm^2$. The gate insulator layer 3, that was exposed between insulator capped, polysilicon gate structures, is removed during the wet clean procedure, employed as part of the photoresist removal procedure. The result of these process steps is shown schematically in FIG. 1.

Figure 2:
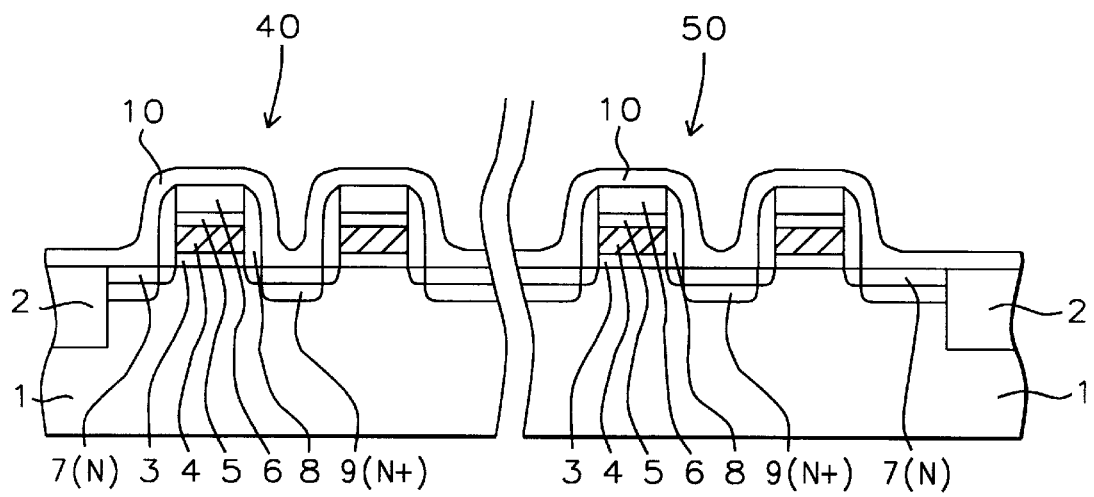

A second silicon nitride layer is next deposited, using LPCVD or plasma enhanced chemical vapor deposition, (PECVD), processing, to a thickness between about 1000 to 2000 Angstroms. followed by an anisotropic, RIE procedure, using $SF_6$ as an etchant, creating silicon nitride spacers 8, on the sides of the insulator capped, polysilicon gate structures. This is followed by another ion implantation procedure, again using either phosphorous or arsenic, at an energy between about 50 to 75 KeV, at a dose between about 1E14 to 5E15 atoms/$cm^2$, creating heavily doped, N type source and drain regions 9. A second silicon oxide layer 10, used to protect MOS memory regions from a subsequent salicide procedure, that will be applied only to exposed silicon regions in MOS logic region 40, is deposited via LPCVD or PECVD procedures, to a thickness between about 150 to 400 Angstroms. The second silicon oxide layer will be called RPO, or Resist Protective Oxide, used to subsequently protect memory regions from forming the lower resistance metal silicide layers. This is schematically shown in FIG. 2.

Figure 3:
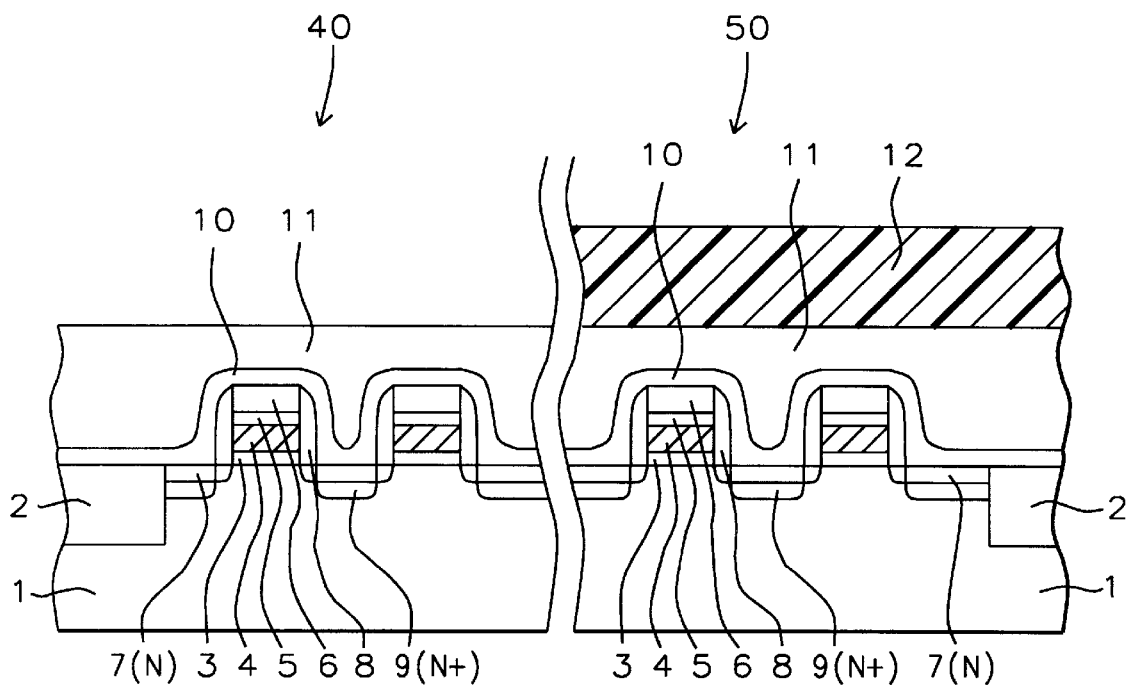
Figure 4:
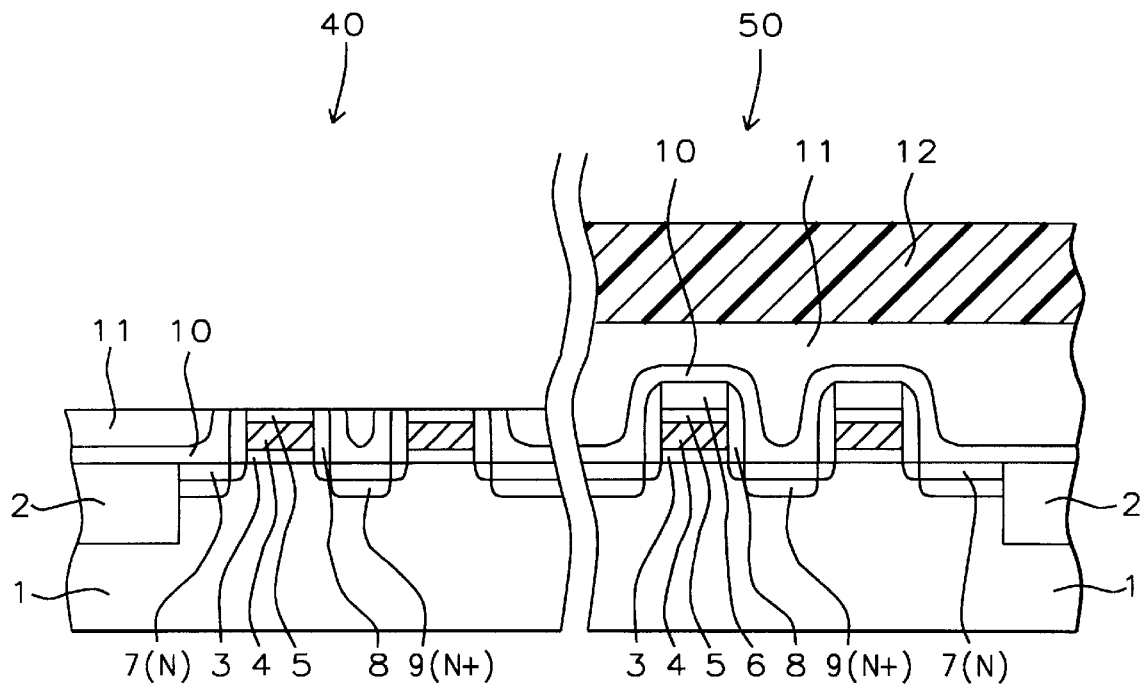
Figure 5:
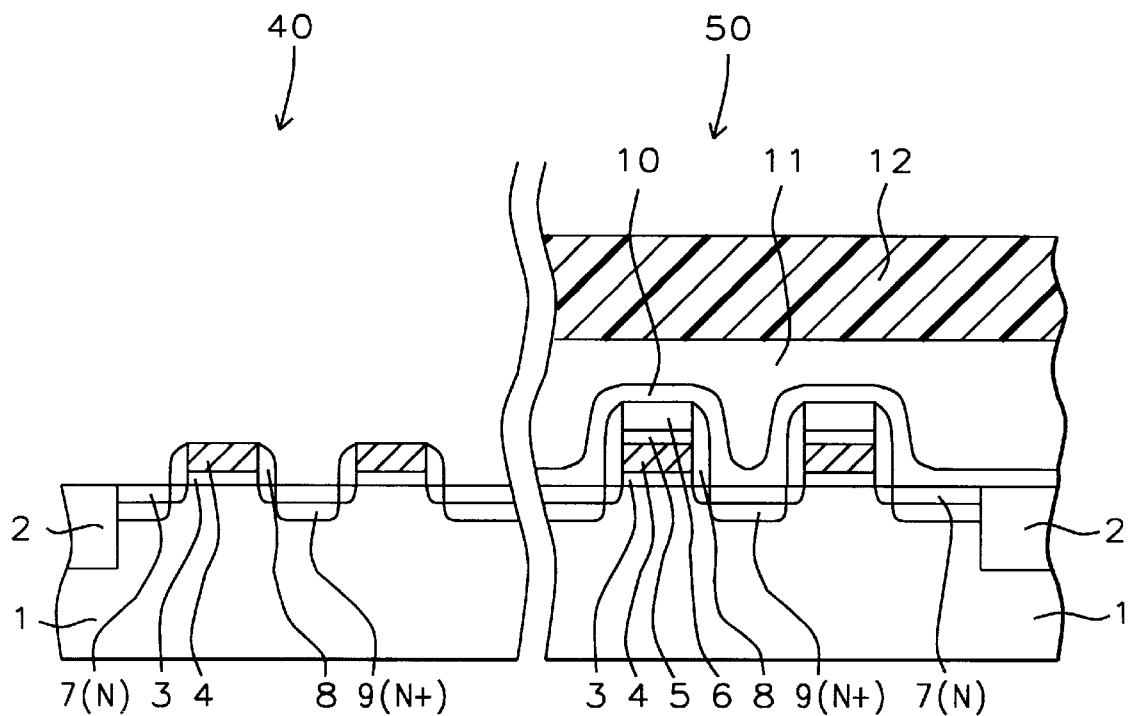

A bottom anti-reflective coating, (BARC), 11, is next applied, to a thickness between about 1000 to 3000 Angstroms. BARC layer 11, can be an non-photosensitive organic material, such as polyimide, and is applied in a manner that results in BARC layer 11, exhibiting a planar top surface. A photoresist shape 12, is next applied, to be used as a block out mask for MOS memory region 50, still leaving BARC layer 11, exposed in MOS logic region 40. This is schematically shown in FIG. 3. A partial etch back of BARC layer 11, is performed in MOS logic region 40, via plasma etching, using a $N_2$—$O_2$ chemistry. Although the etch selectivity of photoresist to BARC is not high, the thickness of photoresist shape 12, is about 75 times thicker than the thickness of BARC layer 11, being removed in MOS logic region 40, therefore still resulting in the desired protection for MOS memory region 50. BARC layer 11, is etched back to a point in which RPO, or second silicon oxide layer 10, overlying the insulator capped, polysilicon gate structures, in MOS logic region 40, is exposed. At this point, with photoresist shape 12, still protecting MOS memory region 50, RPO layer 10, and first silicon nitride layer 6, are removed from the polysilicon gate structures, now capped with only first silicon oxide layer 5. This is accomplished via an anisotropic RIE procedure, using $CHF_3$ as an etchant for RPO layer 10, while $SF_6$ is used as an etchant for first silicon nitride layer 6. The result of this procedure is schematically shown in FIG. 4. With photoresist shape 12, still in place, BARC layer 11, is removed from MOS logic region 40, via a plasma etch procedure, using $N_2$—$O_2$, which does not attack exposed polysilicon gate structure 4. The remaining portions of RPO layer 10, as well as first silicon oxide layer 5, overlying the polysilicon gate structures, in MOS logic region 40, are now removed using a buffered hydrofluoric solution, resulting in the exposure of the top surface of the polysilicon gate structure, as well as the exposure of heavily doped source and drain regions 9, in MOS logic region 40. This is schematically illustrated in FIG. 5.

Figure 6:
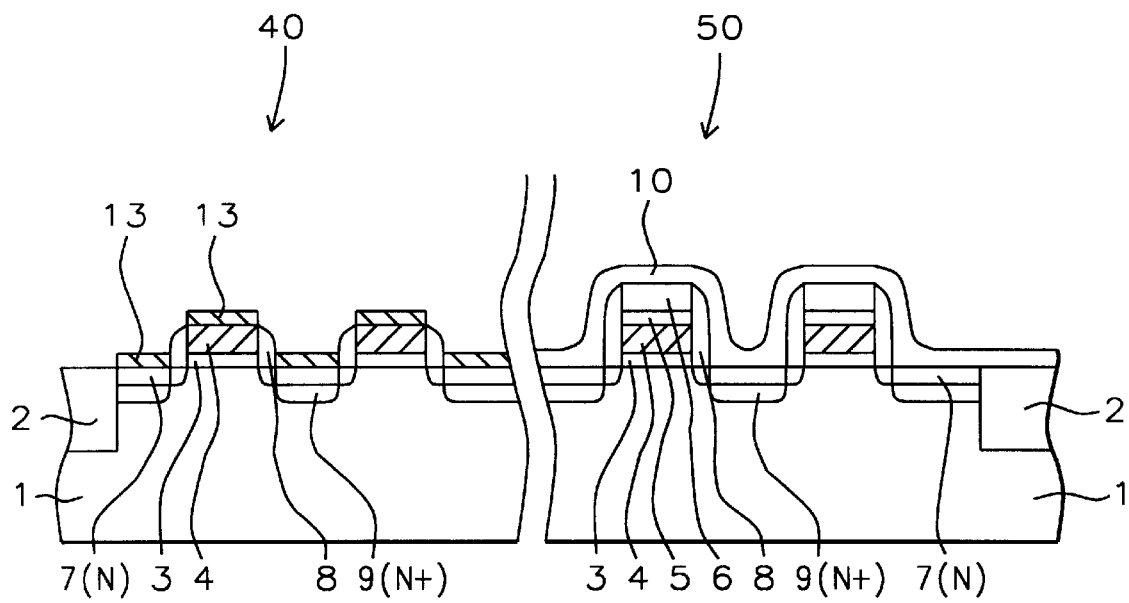

Photoresist shape 12, and BARC layer 11, are next removed via plasma oxygen ashing, and careful wet cleans, followed by the deposition of a titanium layer, deposited using R.F. sputtering procedures, to a thickness between about 200 to 500 Angstroms. A first rapid thermal anneal, (RTA), procedure is performed at a temperature between about 650 to 800° C., for a time between about 10 to 40 sec, in a nitrogen ambient, converting titanium to a titanium silicide layer, in regions in which titanium resided on exposed silicon surfaces. Therefore titanium silicide is formed on, and self-aligned to, the heavily doped source and drain region 9, and on the top surface of polysilicon layer 4, of the polysilicon gate structures, in MOS logic region 40. RPO layer 10, in MOS memory region 50, prevented titanium from directly interfacing silicon surfaces, thus avoiding titanium silicide formation, in MOS memory region 50. Unreacted titanium, residing on RPO layer 10, in MOS memory region 50, and on silicon nitride spacers 8, in MOS logic region 40, is removed using a wet solution comprised of $NH_4OH$—$H_2O_2$—$H_2O$, resulting in the salicide formation, or self-aligned titanium silicide layer 13, shown schematically in FIG. 6. A second RTA anneal is next employed, at a temperature between about 800 to 900° C., for a time between about 10 to 40 sec, in a nitrogen ambient. The second RTA procedure is convert titanium silicide region 13, to a lower resistivity phase.

Figure 7:
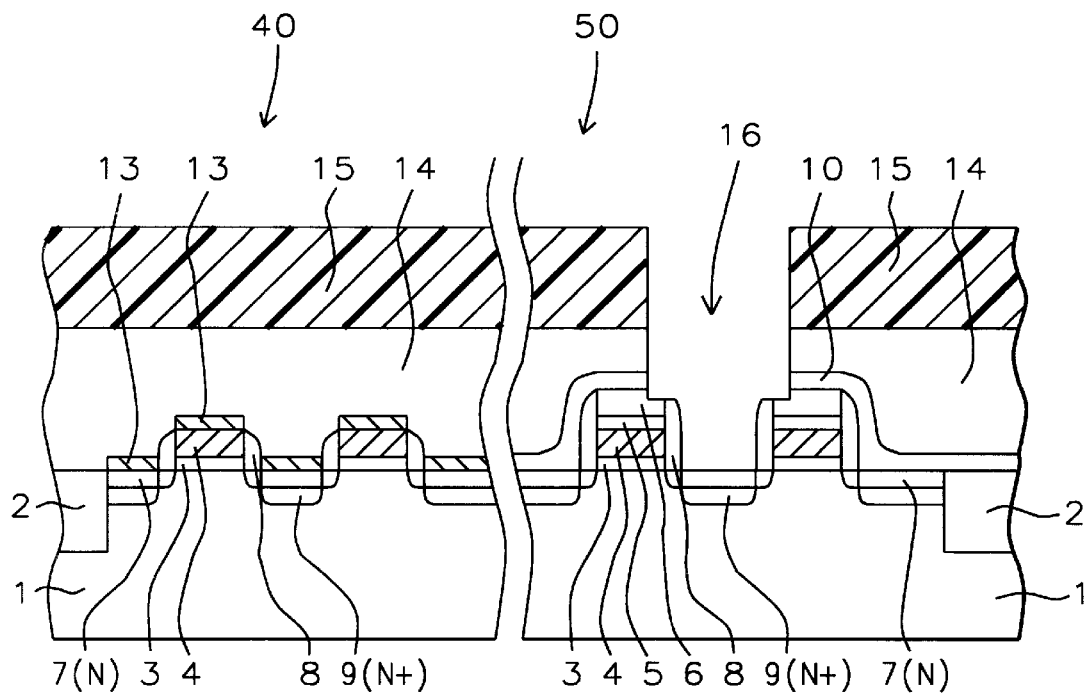

An interlevel insulator layer 14, is next deposited, via PECVD procedures, to a thickness between about 2000 to 5000 Angstroms. Interlevel insulator layer 14, can be a silicon oxide layer, a phosphosilicate layer, or a boro-phosphosilicate layer. A chemical mechanical polishing procedure is used to planarize interlevel insulator layer 14. A photoresist shape 15, is then used to allow SAC opening 16, shown schematically in FIG. 7, to be created, exposing heavily doped source and drain region 9, in MOS memory region 50. Referring to SAC opening 16, density requirements for memory applications make the concept of opening a contact hole, and fully land the contact hole on a source and drain region, difficult to achieve. In order to conserve silicon real estate, a self-aligned contact, (SAC), structure has been employed. This procedure comprises a lithographic contact hole dimension, SAC opening 16, in this case, with a diameter greater than the width of heavily doped source and drain region 9, which resides between insulator capped, polysilicon gate structures, in MOS memory region 50. Since the SAC opening 16, will overlap the insulator filled, polysilicon gate structures, the area allotted for heavily doped source and drain region 9, can be minimized, thus reducing the area of the MOS memory device, and thus increasing density. Thus SAC opening 16, exposing heavily doped source and drain region 9, is made using anisotropic RIE of interlevel oxide layer, and RPO layer 10, using $CHF_3$ as an etchant. The selective, anisotropic RIE procedure, is terminated at the first silicon nitride layer 6, on the polysilicon gate structures. This is schematically shown in FIG. 7.

Figure 8:
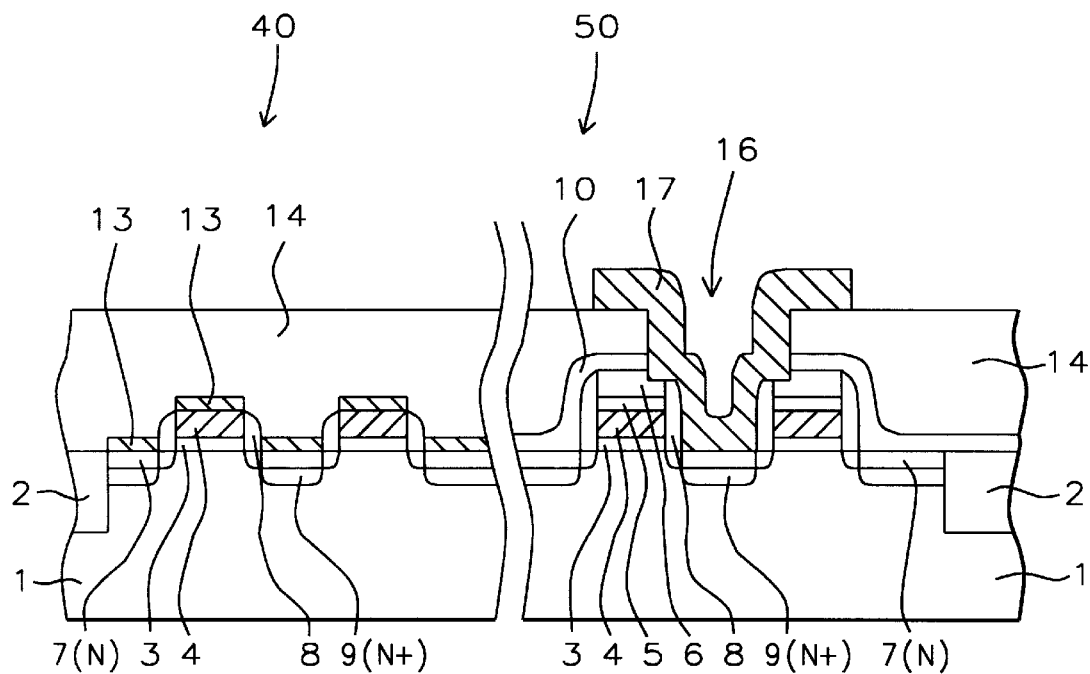

After removal of photoresist shape 16, using oxygen ashing and careful wet cleans, a polysilicon layer is deposited via LPCVD procedures, to a thickness between about 1000 to 2500 Angstroms. The polysilicon layer can either be doped in situ, during deposition, or deposited intrinsically, and than doped via an ion implantation procedure, using arsenic or phosphorous. Photolithographic and anisotropic RIE procedures, using $Cl_2$ as an etchant, are used to create polysilicon SAC structure 17, schematically shown in FIG. 8. The photoresist shape, used as a mask for definition of polysilicon SAC structure 17, is removed using plasma oxygen ashing and careful wet cleans. Contact holes to active regions in MOS logic region 40, as well as to other active regions in MOS memory region 50, not shown in the drawings, can also be achieved via conventional photolithographic and anisotropic RIE procedures, applied to interlevel insulator layer 14. Subsequent metal structures can than be formed, contacting active regions, exposed in these contact holes.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating MOS memory devices, and MOS logic devices on a single semiconductor substrate, comprising the steps of:

forming insulator capped polysilicon gate structures, on a gate insulator layer, with silicon nitride spacers on the sides of said insulator capped polysilicon gate structures;

forming source and drain regions, in regions of said semiconductor substrate, not covered by said insulator capped polysilicon gate structures;

depositing a protective silicon oxide layer;

applying an organic coating;

partially removing said organic coating, from a first region of said semiconductor substrate, used for said MOS logic devices, resulting in a thin organic coating, exposing the top surface of said protective silicon oxide layer, on said insulator capped polysilicon gate structures;

removing said protective silicon oxide layer, and a capping silicon nitride layer, from the top surface of said insulator capped polysilicon gate structures, in said first region of said semiconductor substrate, exposing the top surface of silicon oxide capped polysilicon gate structures;

removing said thin organic layer from said first region of said semiconductor substrate, exposing said silicon oxide capped polysilicon gate structures, and exposing protective silicon oxide layer on a first source and drain region;

removing remaining protective silicon oxide layer from said first source and drain region, and removing silicon oxide from the top surface of polysilicon gate structures, in said first region of said semiconductor substrate;

removing said organic coating from a second region of said semiconductor substrate, used for said MOS memory devices, exposing said protective silicon oxide layer, overlying said insulator capped polysilicon gate structures, and overlying a second source and drain region;

forming a metal silicide layer on the exposed top surface of said polysilicon gate structures, and forming a metal silicide layer on said first source and drain region, located between said polysilicon gate structures, in said first region of said semiconductor substrate;

depositing an interlevel insulator layer;

creating an opening in said interlevel insulator layer, and in said protective silicon oxide layer, in said second region of said semiconductor substrate, exposing said second source and drain region, located between said insulator capped polysilicon gate structures, and exposing segments of the top surface of said insulator capped polysilicon gate structures; and forming a polysilicon contact structure, contacting said second source and drain region, while overlying exposed segments of the top surface of said insulator capped polysilicon gate structures, and overlying the top surface of said interlevel insulator layer.

2. The method of claim 1, wherein the insulator layers, of said insulator capped polysilicon gate structures, are an overlying, first silicon nitride layer, deposited using LPCVD or PECVD procedures, to a thickness between about 1000 to 2000 Angstroms, and an underlying, first silicon oxide layer, deposited using LPCVD or PECVD procedures, to a thickness between about 200 to 1000 Angstroms.

3. The method of claim 1, wherein the polysilicon layer, of said insulator capped polysilicon gate structures, is deposited using LPCVD procedures, to a thickness between about 1000 to 2000 Angstroms, and doped in situ during deposition, via the addition of arsine or phosphine, to a silane ambient, or deposited intrinsically, and doped via ion implantation of arsenic or phosphorous.

4. The method of claim 1, wherein said insulator capped polysilicon gate structures are formed via an anisotropic RIE procedure, using $SF_6$ as an etchant for the first silicon nitride layer, using $CHF_3$ as an etchant for the first silicon oxide layer, and using $Cl_2$ as an etchant for the polysilicon layer.

5. The method of claim 1, wherein said silicon nitride spacers are formed via deposition of a second silicon nitride layer, using LPCVD or PECVD procedures, to a thickness between about 1000 to 2000 Angstroms, followed by an anisotropic RIE procedures, using $SF_6$ as an etchant.

6. The method of claim 1, wherein said protective silicon oxide layer is deposited using LPCVD or PECVD procedures, to a thickness between about 150 to 400 Angstroms.

7. The method of claim 1, wherein said organic layer is a non-photosensitive, bottom anti-reflective coating, such as a polyimide layer, applied to a thickness between about 1000 to 3000 Angstroms.

8. The method of claim 1, wherein said organic layer is partially removed, creating said thin organic coating, via a plasma etching procedure, using $N_2$—$O_2$ as etchants.

9. The method of claim 1, wherein said protective silicon oxide layer, and said insulator layers, are removed from the top surface of said insulator capped polysilicon gate structures, in said first region of said semiconductor substrate, via RIE procedures, using $CHF_3$ as an etchant for said protective silicon oxide layer, and using $SF_6$ as an etchant for said first silicon nitride layer, while said first silicon oxide layer is removed using a buffered hydrofluoric acid solution.

10. The method of claim 1, wherein said metal silicide layer is a titanium silicide, formed via R.F. sputter deposition of a titanium layer, followed by a first RTA procedure, performed at a temperature between about 650 to 800° C., removal of unreacted titanium, using a wet solution comprised of $NH_4OH$—$H_2O_2$—$H_2O$, and a second RTA procedure, performed at a temperature between about 800 to 900° C.

11. The method of claim 1, wherein said interlevel insulator layer is chosen from a group that includes a silicon oxide layer, a boro-phosphosilicate layer, and a phosphosilicate layer, deposited using PECVD procedures, to a thickness between about 2000 to 5000 Angstroms.

12. The method of claim 1, wherein said opening in said interlevel insulator layer, and in said protective silicon oxide layer, is created using anisotropic RIE procedures using $CHF_3$ as an etchant, with said opening exposing said second source and drain region, and exposing a region of the top surface of said insulator capped polysilicon gate structure.

13. The method of claim 1, wherein said polysilicon contact structure is formed via deposition of a polysilicon layer, using LPCVD procedures, to a thickness between about 1000 to 3000 Angstroms, and patterned via as anisotropic RIE procedure, using $Cl_2$ as an etchant.

14. A method of fabricating MOS logic devices, featuring self-aligned metal silicide regions, and MOS memory devices, featuring self-alignment contact structures, on a single semiconductor substrate, using a masking bottom anti-reflective coating, (BARC), layer to prevent the formation of metal silicide regions on said MOS memory devices, comprising the steps of:

growing a gate insulator layer on said semiconductor substrate;

depositing a first polysilicon layer;

depositing a first silicon oxide layer;

depositing a first silicon nitride layer;

patterning of said first silicon nitride layer, of said first silicon oxide layer, and of said first polysilicon layer, to create insulator capped polysilicon gate structures;

ion implanting a first conductivity imparting dopant into regions of said semiconductor substrate, not covered by said insulator capped polysilicon gate structures, to create lightly doped source and drain regions;

depositing a second silicon nitride layer;

anisotropic etching of said second silicon nitride layer to form silicon nitride spacers on the sides of said insulator capped polysilicon gate structures;

ion implanting a second conductivity imparting dopant into an area of said semiconductor substrate, not covered by said insulator capped polysilicon gate structures, and not covered by said silicon nitride spacers, to create heavily doped source and drain regions;

depositing a second silicon oxide layer;

applying said BARC layer;

removing the top portion of said BARC layer, from a first region of said semiconductor substrate, to be used as a MOS logic device region, exposing the top surface of said second silicon oxide layer, on said insulator capped polysilicon gate structures;

removing said second oxide layer from the top surface of said insulator capped polysilicon gate structures, in said MOS logic device region;

removing said first silicon nitride layer from the top surface of said insulator capped polysilicon gate structures, in said MOS logic device region;

removing bottom portion of said BARC layer, in said MOS logic device region, exposing silicon oxide capped polysilicon gate structures, and said second silicon oxide layer, overlying a first heavily doped source and drain region;

removing said first silicon oxide layer from the top surface of polysilicon gate structures, and removing said second silicon oxide layer from said first heavily doped source and drain region, in said MOS logic device region;

removing said BARC layer, from a second region of said semiconductor substrate, to be used as a MOS memory device region, exposing said second silicon oxide layer overlaying said insulator capped polysilicon gate structures;

depositing a titanium layer;

performing a first RTA procedure, forming a titanium silicide layer on the top surface of said polysilicon gate structure, and on said first heavily doped source and drain region of said MOS logic device regions;

removing regions of unreacted titanium layer;

performing a second RTA procedure;

depositing an interlevel insulator layer;

opening a self-aligned contact, (SAC), hole in said interlevel insulator layer, and in said second silicon oxide layer, exposing a second heavily doped source and drain region, between said insulator capped polysilicon gate structures, in said MOS memory device region, with said SAC hole opened to a diameter that includes an overlapping of a region of said insulator capped polysilicon gate structures;

depositing a second polysilicon layer; and patterning of said second polysilicon layer to form a self-aligned contact, (SAC), structure, in said SAC hole, contacting said second heavily doped source and drain region, in said MOS memory device region, with said self-aligned contact structure overlapping a region of the top surface of said insulator capped polysilicon gate structure.

15. The method of claim 14, wherein said gate insulator layer is silicon dioxide, thermally grown in an oxygen-steam ambient at a temperature between about 750 to 1000° C., to a thickness between about 20 to 200 Angstroms.

16. The method of claim 14, wherein said first polysilicon layer is deposited using LPCVD procedures, to a thickness between about 1000 to 2000 Angstroms, than in situ doped, during deposition via the addition of either arsine, or phosphine, to a silane ambient.

17. The method of claim 14, wherein said first silicon oxide layer is deposited using LPCVD or PECVD procedures, to a thickness between about 200 to 1000 Angstroms.

18. The method of claim 1, wherein said first silicon nitride layer is deposited using LPCVD or PECVD procedures, to a thickness between about 1000 to 2000 Angstroms.

19. The method of claim 14, wherein said insulator capped polysilicon gate structures are patterned using anisotropic RIE, using $SF_6$ as an etchant for said first silicon nitride layer, using $CHF_3$ as an etchant for said first silicon oxide layer, and using $Cl_2$ as an etchant for said first polysilicon layer.

20. The method of claim 14, wherein said second silicon oxide layer is deposited using LPCVD or PECVD procedures, to a thickness between about 150 to 400 Angstroms.

21. The method of claim 14, wherein said BARC layer is a non-photosensitive organic layer, such as polyimide, applied to a thickness between about 1000 to 3000 Angstroms.

22. The method of claim 14, wherein the top portion of said BARC layer is removed from said MOS logic device regions, via a plasma etching procedure, using $N_2$—$O_2$ as etchants.

23. The method of claim 14, wherein said second silicon oxide layer, and said first silicon nitride layer, are removed from the top surface of said insulator capped polysilicon gate structures, in said MOS logic device region, via an anisotropic RIE procedure, using $CHF_3$ as an etchant for said second silicon oxide layer, while using $SF_6$ as an etchant for said first silicon nitride layer.

24. The method of claim 14, wherein said first silicon oxide layer, is removed from the top surface of said insulator capped polysilicon gate structures, in MOS logic device region, via a buffered hydrofluoric acid solution.

25. The method of claim 14, wherein said titanium layer is deposited using r.f. sputtering, to a thickness between about 200 to 500 Angstroms.

26. The method of claim 14, wherein said titanium silicide layers are formed, on silicon regions in said MOS logic device region, using said first RTA procedure, at a temperature between about 650 to 800° C., and using said second RTA procedure, performed at a temperature between about 800 to 900° C.

27. The method of claim 14, wherein said SAC hole is opened in said second silicon oxide layer, and in said interlevel insulator layer, via anisotropic RIE procedures, using $CHF_3$ as an etchant.

28. The method of claim 14, wherein said SAC structure is comprised of polysilicon, obtained from deposition of said second polysilicon layer, using LPCVD procedures, at a thickness between about 1000 to 3000 Angstroms, and patterned via an anisotropic RIE procedure, using $Cl_2$ as an etchant.

* * * * *